US010553658B2

(12) United States Patent
Oh

(10) Patent No.: US 10,553,658 B2
(45) Date of Patent: Feb. 4, 2020

(54) ENCAPSULATION UNIT AND ORGANIC LIGHT EMITTING DISPLAY DEVICE INCLUDING THE SAME

(71) Applicant: LG Display Co., Ltd., Seoul (KR)

(72) Inventor: Jae-Young Oh, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/815,282

(22) Filed: Nov. 16, 2017

(65) Prior Publication Data

US 2018/0151642 A1    May 31, 2018

(30) Foreign Application Priority Data

Nov. 30, 2016    (KR) ........................ 10-2016-0161514

(51) Int. Cl.
H01L 27/32    (2006.01)
H01L 23/29    (2006.01)
H01L 23/31    (2006.01)

(52) U.S. Cl.
CPC ........ H01L 27/3241 (2013.01); H01L 23/291 (2013.01); H01L 23/31 (2013.01)

(58) Field of Classification Search
CPC ... H01L 27/3241; H01L 23/291; H01L 23/31; H01L 23/3121; H01L 23/3135; H01L 23/3142; H01L 23/315; H01L 27/3244; H01L 51/5246; H01L 51/5253
See application file for complete search history.

(56) References Cited

U.S. PATENT DOCUMENTS

| 2005/0046347 A1* | 3/2005 | Kato | H01L 51/5253 313/512 |
|---|---|---|---|
| 2006/0097264 A1* | 5/2006 | Kim | H01L 51/5265 257/72 |
| 2006/0113903 A1* | 6/2006 | Kim | H01L 27/3251 313/506 |
| 2013/0056714 A1* | 3/2013 | Hasegawa | H01L 51/5218 257/40 |
| 2013/0193421 A1* | 8/2013 | Marks | B82Y 10/00 257/40 |
| 2016/0093828 A1* | 3/2016 | Kim | H01L 51/5253 257/40 |
| 2018/0097034 A1* | 4/2018 | Lee | H01L 27/156 |
| 2018/0102502 A1* | 4/2018 | Kim | H01L 22/12 |
| 2018/0108717 A1* | 4/2018 | Seol | H01L 51/0097 |

* cited by examiner

Primary Examiner — Peter Bradford
(74) Attorney, Agent, or Firm — Seed IP Law Group LLP

(57) ABSTRACT

Disclosed are an encapsulation unit which may prevent deterioration of thin film transistors so as to improve reliability and an organic light emitting display device including the same. At least one transparent oxide film is disposed under at least one of a plurality of inorganic encapsulation films disposed on a light emitting element and, thus, oxygen in the at least one transparent oxide film combines with hydrogen introduced during formation of the inorganic encapsulation films to prevent hydrogen from diffusing into the thin film transistors.

23 Claims, 4 Drawing Sheets

ENCAPSULATION UNIT AND ORGANIC LIGHT EMITTING DISPLAY DEVICE INCLUDING THE SAME

CROSS-REFERENCE TO RELATED APPLICATION

This application claims priority from and the benefit of Korean Patent Application No. P2016-0161514, filed on Nov. 30, 2016, which is hereby incorporated by reference as if fully set forth herein.

BACKGROUND

Technical Field

The present disclosure relates to an encapsulation unit and an organic light emitting display device including the same, and more particularly, to an encapsulation unit which prevents deterioration of thin film transistors so as to improve reliability and an organic light emitting display device including the same.

Description of the Related Art

In a flat panel display device, thin film transistors (TFTs) are used as switching elements and/or driving elements. Thin film transistors include thin film transistors using amorphous silicon, thin film transistors using polycrystalline silicon, and thin film transistors using an oxide semiconductor according to materials used as an active layer. Among all those, thin film transistors using an oxide semiconductor have higher mobility than thin film transistors using amorphous silicon, remarkably lower leakage current than thin film transistors using amorphous silicon and thin film transistors using polycrystalline silicon, and relatively high reliability. Further, thin film transistors using an oxide semiconductor are advantageous in that threshold voltage (Vth) distribution is uniform, as compared to thin film transistors using polycrystalline silicon.

A plurality of inorganic films is formed on such thin film transistors using an oxide semiconductor. If these inorganic films are grown through a PECVD process, a hydrogen content in the inorganic films is about 15 to 30%. When hydrogen contained in the inorganic films is diffused into an active layer of the thin film transistor, diffused hydrogen reacts with oxygen contained in the oxide semiconductor and, thus, characteristics (for example, threshold voltage, etc.) of the thin film transistor are changed and reliability of the thin film transistor may be lowered.

BRIEF SUMMARY

Accordingly, the present disclosure is directed to an encapsulation unit and an organic light emitting display device including the same that, among others, substantially obviate one or more problems due to limitations and disadvantages of the related art.

An object of the present disclosure is to provide an encapsulation unit which prevents deterioration of thin film transistors so as to improve reliability and an organic light emitting display device including the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light emitting display device includes light emitting elements disposed on a substrate, and an encapsulation unit disposed on each of the light emitting elements, wherein the encapsulation unit includes a plurality of inorganic encapsulation films, at least one organic encapsulation film disposed between the inorganic encapsulation films, and at least one transparent oxide film disposed under at least one of the inorganic encapsulation films.

In another aspect of the present disclosure, an encapsulation unit includes a plurality of inorganic encapsulation films, at least one organic encapsulation film disposed between the inorganic encapsulation films, and at least one transparent oxide film disposed under at least one of the inorganic encapsulation films.

It is to be understood that both the foregoing general description and the following detailed description of the present disclosure are examples and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Figure 1:
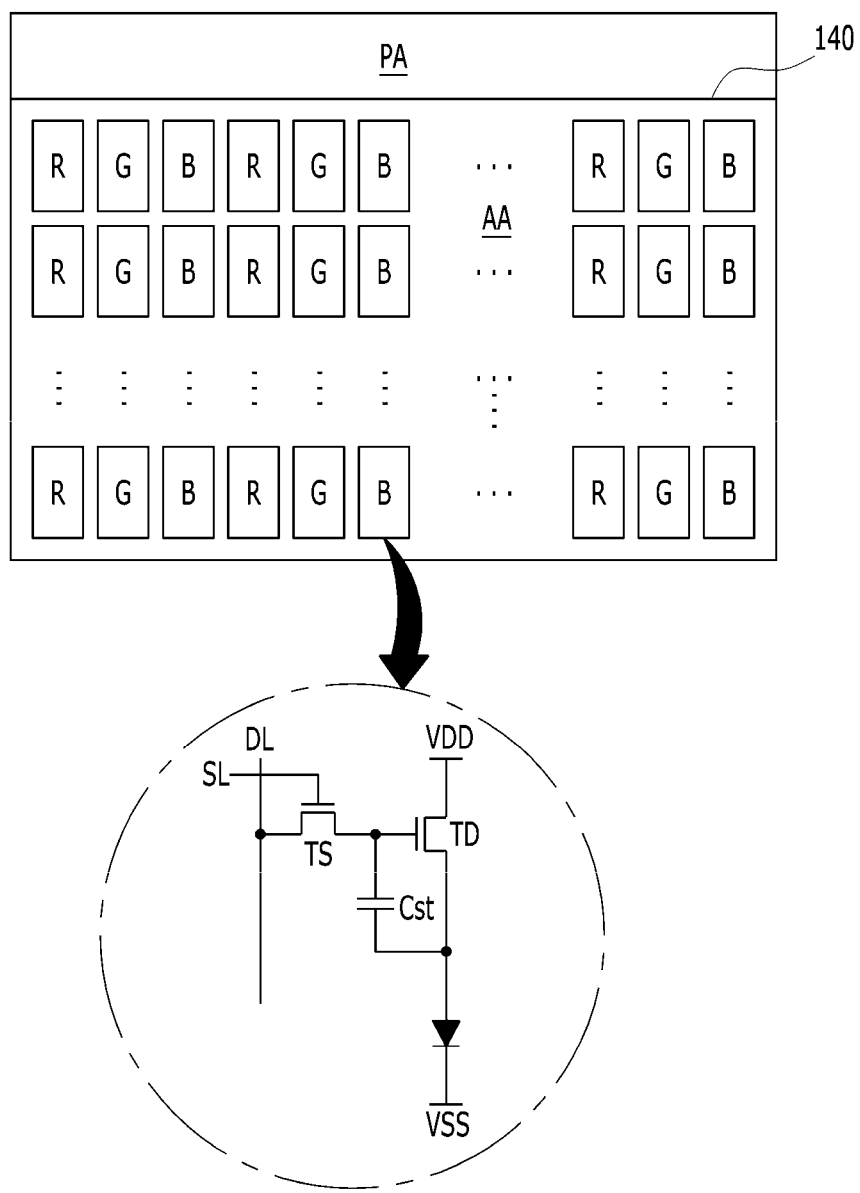
FIG. 1 is a plan view of an organic light emitting display device in accordance with the present disclosure.
Figure 2:
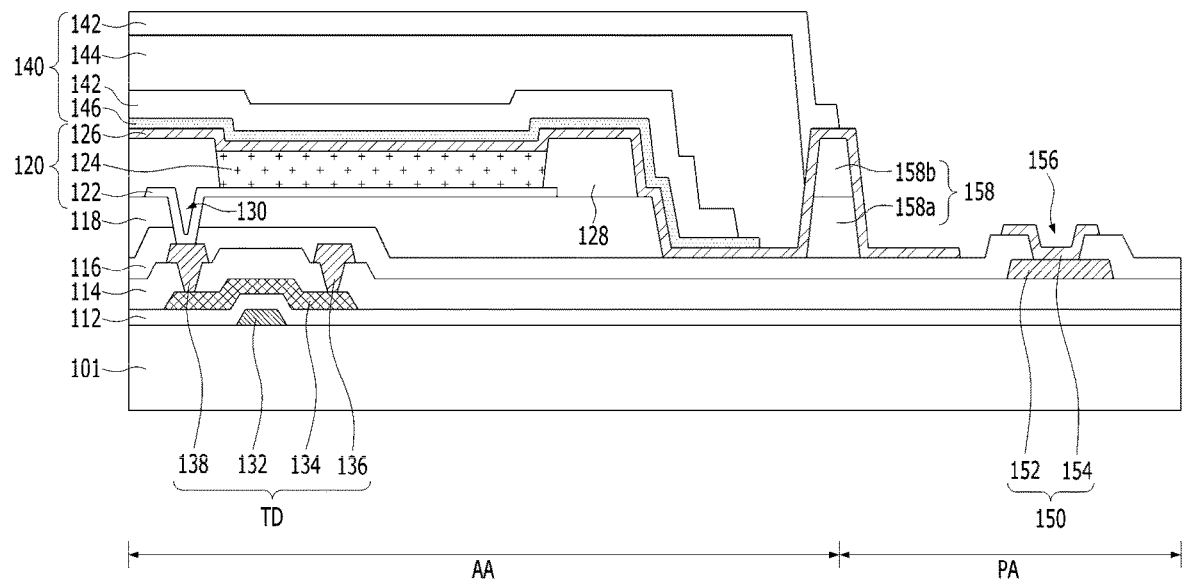
FIG. 2 is a cross-sectional view of the organic light emitting display device shown in FIG. 1.

FIG. 1 is a plan view of an organic light emitting display device in accordance with the present disclosure and FIG. 2 is a cross-sectional view of the organic light emitting display device shown in FIG. 1.

The organic light emitting display device shown in FIGS. 1 and 2 is provided with a pixel array area (referred to herein as "array area") AA and a pad area PA.

In the pad area PA, a plurality of pads 150 to respectively supply driving signals to scan lines SL, data lines DL, a high voltage (VDD) supply line and a low voltage (VSS) supply line located in the array area AA is formed. The pads 150 are exposed by an encapsulation unit 140 formed to cover the array area AA. Each of the pads 150 includes a pad electrode 152 and a pad cover electrode 154.

The pad electrode 152 is formed of the same material as at least one of a gate electrode 132 and a source electrode 136. The pad electrodes 152 of the pads 150 are connected to signal lines including the scan lines SL, the data lines DL, the high voltage (VDD) supply line and the low voltage (VSS) supply line located in the array area AA.

The pad cover electrode 154 is conductively connected to the pad electrode 152 exposed through a pad contact hole 156 formed through a protective film 116. Further, the pad cover electrode 154 is exposed to the outside and contacts a circuit transfer film connected to a driving circuit. Here, the pad cover electrode 154 is formed of a metal having high corrosion resistance and high acid resistance, on the protective film 116 and may thus be prevented from being corroded by external moisture even if it is exposed to the outside. For example, the pad cover electrode 154 is formed of the same material as one of an anode 122 and a cathode 126, on the protective film 116. That is, the pad cover electrode 154 is formed of a transparent conductive film having high corrosion resistance and high acid resistance, such as indium-tin-oxide (ITO) or indium-zinc-oxide (IZO).

The array area AA displays an image through unit pixels including light emitting elements 120. The unit pixels include red (R) sub-pixels, green (G) sub-pixels and blue (B) sub-pixels, or include red (R) sub-pixels, green (G) sub-pixels, blue (B) sub-pixels and white (W) sub-pixels. Each sub-pixel generates color light using the light emitting element 120, or generates color light using the light emitting element 120 emitting white light and a color filter (not shown).

Each of the sub-pixels includes a pixel driving circuit, and the light emitting element 120 connected to the pixel driving circuit.

The pixel driving circuit includes a switching thin film transistor TS, a driving thin film transistor TD and a storage capacitor Cst, or further includes a sensing transistor. The configuration of the pixel driving circuit shown in FIG. 1 is just one embodiment and the present disclosure is not limited thereto.

The switching thin film transistor TS is turned on when a scan pulse is supplied to the scan line, and supplies a data signal supplied to the data line to the storage capacitor Cst and the gate electrode 132 of the driving thin film transistor TD.

The driving thin film transistor TD controls current I supplied from the high voltage (VDD) supply line to the light emitting element 120 in response to the data signal supplied to the gate electrode 132 of the driving thin film transistor TD, thus adjusting an amount of light emitted from the light emitting element 120. Further, even if the switching thin film transistor TS is turned off, the driving thin film transistor TD supplies constant current I due to voltage charged in the storage capacitor Cst until a data signal of a next frame is supplied, and thus maintains emission of light from the light emitting element 120.

The driving thin film transistor TD includes the gate electrode 132, an active layer 134, the source electrode 136 and a drain electrode 138.

The gate electrode 132 is formed on a substrate 101 and overlaps the active layer 134 with a gate insulating film 112 interposed therebetween. The gate electrode 132 may have a single layer structure including one selected from the group of molybdenum (Mo), aluminum (Al), chrome (Cr), gold (Au), titanium (Ti), nickel (Ni), neodymium (Nd) and copper (Cu) or an alloy thereof or have a multilayer structure including the same, but the present disclosure is not limited thereto.

The active layer 134 is formed on the gate insulating film 112 so as to overlap the gate electrode 132, thus forming a channel between the source and drain electrodes 136 and 138. The active layer 134 is formed of an oxide semiconductor including at least one metal selected from the group consisting of Zn, Cd, Ga, In, Sn, Hf and Zr, or is formed of polycrystalline silicon or amorphous silicon.

The source and drain electrodes 136 and 138 are formed so as to be opposite each other across the channel 134 of the active layer 134. The source and drain electrodes 136 and 138 are formed on an interlayer insulating film 114 so as to have a single layer structure or a multilayer structure including one selected from the group of molybdenum (Mo), aluminum (Al), chrome (Cr), gold (Au), titanium (Ti), nickel (Ni), neodymium (Nd) and copper (Cu) or an alloy thereof, but the present disclosure is not limited thereto. The interlayer insulating film 114 to cover the active layer 134 exposed between the source and drain electrodes 136 and 138 is formed on the gate insulating film 112, and the interlayer insulating film 114 protects the active layer 134 from oxygen, moisture, etc. and thus prevents damage to the active layer 134. Instead of the interlayer insulating film 114 formed on the gate insulating film 112, an etch stopper to cover only a region of the active layer 134 exposed between the source and drain electrodes 136 and 138 may be provided.

The light emitting element 120 includes the anode 122, at least one light emitting stack 124 formed on the anode 122, and the cathode 126 formed on the light emitting stack 124. If the anode 122 is a transflective electrode and the cathode 126 is a reflective electrode, the organic light emitting display device is a rear emission type light emitting structure in which light is emitted from the rear surface of the substrate 101. If the anode 122 is a reflective electrode and the cathode 126 is a transflective electrode, the organic light emitting display device is a front emission type light emitting structure in which light is emitted from the front surface of an encapsulation unit 140. In the present disclosure, the anode 122 formed as a reflective electrode and the cathode 126 formed as a transflective electrode will be described as an illustrative example.

The anode 122 is conductively connected to the drain electrode 138 of the driving thin film transistor TD exposed through a pixel contact hole 130 formed through the protective film 116 and a planarization film 118. If the anode 122 is applied to a front emission type light emitting structure, the anode 122 is formed to have a multilayer structure in which an opaque conductive film and a transparent conductive film formed of indium-tin-oxide (ITO) or indium-zinc-oxide (IZO) are stacked. The light emitting stack 124 is formed on the anode 122 in an emission area defined by a bank 128. The at least one light emitting stack 124 is formed by stacking a hole related layer, an organic light emitting layer and an electron related layer on the anode 122 in regular order or in reverse order. For example, the light emitting stack 124 may include first and second light emitting stacks disposed opposite each other with a charge generation layer interposed therebetween. In this case, an organic light emitting layer of one of the first and second light emitting stacks generates blue light, and an organic light emitting layer of the other of the first and second light emitting stacks generates yellowish green light, thus producing white light through the first and second light emitting stacks. The cathode 126 is formed to be opposite the anode 122 with the light emitting stack 124 interposed therebetween. If the cathode 126 is applied to a front emission type organic light emitting display device, the cathode 126 is formed of a metal, an inorganic material, a metal mixed layer or a mixture thereof. Here, the metal forming the cathode 126 may be Ag, Mg, Yb, Li or Ca, the inorganic material may be $Li_2O$, CaO, LiF or $MgF_2$, and they assist movement of electrons so as to supply a large amount of electrons to the light emitting stack 124. For example, the cathode 126 is formed of MgAg.

The encapsulation unit 140 prevents external moisture or oxygen from permeating into the light emitting element 120, which is vulnerable to external moisture or oxygen. For this purpose, the encapsulation unit 140 includes at least one transparent oxide film 146, at least two inorganic encapsulation films 142, and at least one organic encapsulation film 144. In an embodiment, one inorganic encapsulation film 142 is disposed as the uppermost layer of the encapsulation unit 140, and the transparent oxide film 146 is disposed as the lowermost layer of the encapsulation unit 140. In the present disclosure, the encapsulation unit 140 having a structure in which a transparent oxide film 146, an inorganic encapsulation film 142, an organic encapsulation film 144 and an inorganic encapsulation film 142 are sequentially stacked will be described as an illustrative example.

The at least one organic encapsulation film 144 is disposed between the inorganic encapsulation films 142. The organic encapsulation film 144 is formed of an organic insulating material, such as an acrylic resin, an epoxy resin, polyimide, polyethylene or silicon oxycarbide (SiOC). The organic encapsulation film 144 formed of an organic insulating material serves a buffer to relieve stress between respective layers due to bending of the organic light emitting display device, and reinforces planarization performance of the organic light emitting display device. The organic encapsulation film 144 is formed to have a smaller line width than the organic encapsulation film 142 located on the organic encapsulation film 144. Therefore, the upper and side surfaces of the organic encapsulation film 144 are encapsulated by the inorganic encapsulation film 142.

If the organic encapsulation film 144 is formed through an ink jet method, at least one dam 158 forming the boundary with the organic encapsulation film 144 is formed between the pad area PA and the array area AA. The dam 158 prevents the organic encapsulation film 144 in a liquid phase from invading the pad area PA, when the organic encapsulation film 144 in the liquid phase is dropped onto the array area AA. The dam 158 is formed of the same material as at least one of the planarization layer 118, the bank 128 and a diaphragm (not shown) simultaneously with the at least one of the planarization layer 118, the bank 128 and the diaphragm so as to have a single layer structure or a multilayer structure. For example, the dam 158 includes a first dam layer 158a formed of the same material as the planarization layer 118 simultaneously with the planarization layer 118, and a second dam layer 158b formed of the same material as the bank 128 simultaneously with the bank 128, thus omitting an additional mask process for formation of the dam 158 and preventing increase in costs.

The inorganic encapsulation films 142 minimize or prevent permeation of moisture and gases (hydrogen and/or oxygen) into the thin film transistors TS and TD and the organic light emitting element 120. The inorganic encapsulation films 142 are formed to cover the upper and side surfaces of the organic encapsulation film 144 disposed thereunder. These inorganic encapsulation films 142 are formed to have a single layer structure or a multilayer structure including an inorganic insulating material which may be deposited at a low temperature, such as silicon nitride ($SiN_x$), silicon oxide ($SiO_x$), silicon oxy-nitride (SiON) or aluminum oxide ($Al_2O_3$). Since the inorganic encapsulation films 142 are deposited at a low temperature, it is possible to prevent the light emitting stack 124, which is vulnerable to high temperature, from being damaged during the deposition process of the inorganic encapsulation films 142.

The transparent oxide film 146 is disposed under at least one of the inorganic encapsulation films 142. Oxygen contained in the transparent oxide film 146 combines with hydrogen introduced when the inorganic encapsulation films 142 are formed, and thus prevents hydrogen from diffusing into the active layer 134. Therefore, the transparent oxide film 146 may be disposed under the lowermost inorganic encapsulation film 142 out of the inorganic encapsulation films 142. That is, the transparent oxide film 146 may be disposed between the lowermost inorganic encapsulation film 142 which is closest to the light emitting element 120, and the cathode 126.

Although FIG. 2 shows that the transparent oxide film 146 is disposed under the lower inorganic encapsulation films 142 and is disposed as the lowermost layer of the encapsulation unit 140, the disclosure is not limited to this embodiment. It is possible that the transparent oxide film is disposed under the upper inorganic encapsulation films 142, which is also included in the disclosure.

The transparent oxide film 146 is formed of a transparent material, which transmits light emitted from the light emitting element 120 and includes oxygen combining with hydrogen. For example, the transparent oxide film 146 is formed to have a single layer structure or a multilayer structure using the same material as the active layer 134, i.e., at least one of IGZO, IZO, ITO and ZnO.

In this example, in the transparent oxide film 146, an oxygen rate is set to be equal to or higher than a metal rate. For example, a ratio of oxygen to metal in the transparent oxide film 146 is 1:1 or more. Due to the transparent oxide film 146 in which an oxygen rate is higher than a metal rate, transmissivity of light emitted from the light emitting element 120 is increased and a combination rate of hydrogen, introduced when the inorganic encapsulation films 142 are formed, with oxygen is increased.

When oxygen in the transparent oxide film 146 combines with hydrogen and thus the oxygen rate in the transparent oxide film 146 is decreased, the transparent oxide film 146 may become conductive. The conductive transparent oxide film 146 is conductively connected to the cathode 126 and thus conductivity of the cathode 126 is increased.

Further, the transparent oxide film 146 is formed to have a thickness of 10-5,000 Å, and may be formed to have a thickness of 400-600 Å in consideration of transmissivity and deposition time. Here, if the thickness of the transparent oxide film 146 exceeds 5,000 Å, the increased thickness of the transparent oxide film 146 lowers transmissivity of light emitted from the light emitting element 120 and increases a deposition time and, thus, process efficiency is lowered. Further, if the thickness of the transparent oxide film 146 is less than 10 Å, the content of oxygen contained in the transparent oxide film 146 is lower than the content of hydrogen introduced when the inorganic encapsulation films 142 are formed and, thus, the transparent oxide film 146 does not remove hydrogen permeating into the active layer 134.

Figure 3A:
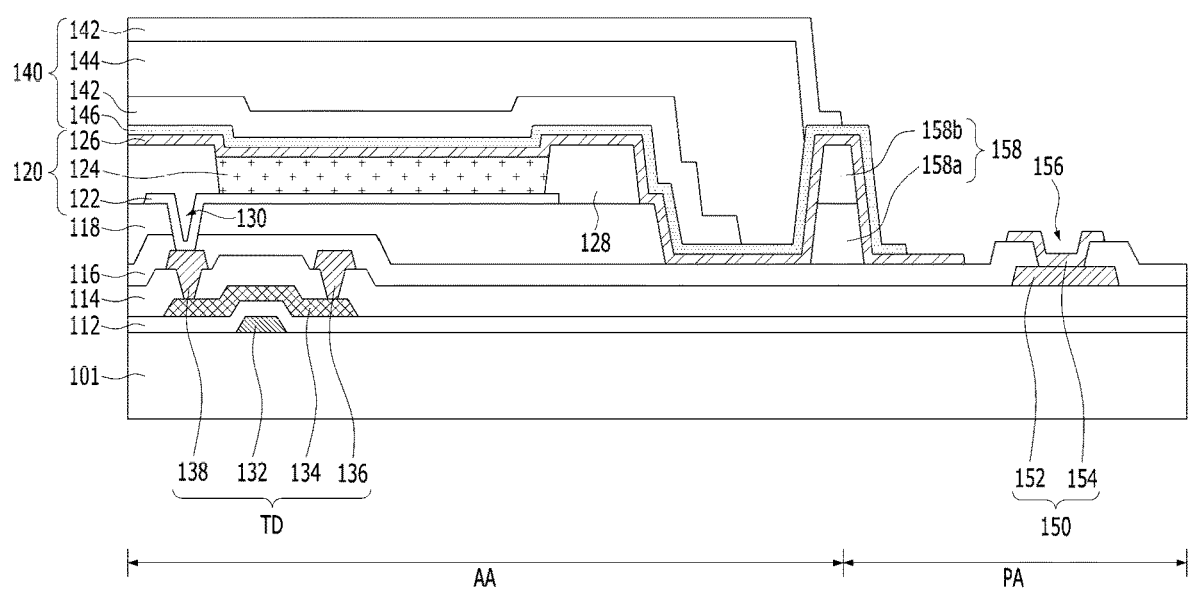
FIGS. 3A and 3B are cross-sectional views of encapsulation units in accordance with various embodiments as shown in FIG. 2.
Figure 3B:
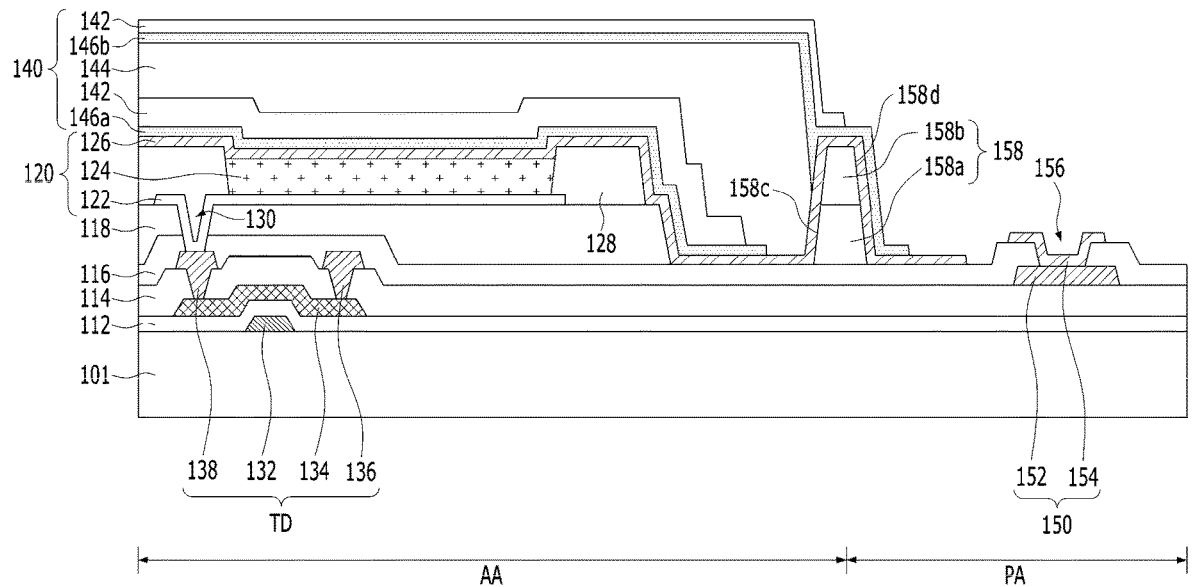

The transparent oxide film 146 is disposed under the lowermost inorganic encapsulation film 142 of the inorganic encapsulation films 142, as shown as an example in S 2 and 3A, or is disposed under each of the inorganic encapsulation films 142, as shown as an example in FIG. 3B.

The transparent oxide film 146 shown in FIG. 2 is disposed to have a greater area than the lowermost inorganic encapsulation film 142 in the array area AA. Since the end of the transparent oxide film 146 protrudes toward the side surface of the dam 158 further or more than the end of the lowermost inorganic encapsulation film 142, a part of the transparent oxide film 146 is exposed by the lowermost inorganic encapsulation film 142. Oxygen contained in the part of the transparent oxide film 146 exposed by the lowermost inorganic encapsulation film 142 combines with hydrogen introduced from the outside. Therefore, the transparent oxide film 146 may prevent not only hydrogen introduced when the inorganic encapsulation films 142 are formed but also hydrogen introduced from the outside from diffusing into the active layer 134.

The transparent oxide film 146 shown in FIG. 3A is disposed not only in the array area AA but also in a part of the pad area PA so as to cover both side surfaces and the upper surface of the dam 158. The transparent oxide film 146 is formed to have a greater area than the uppermost inorganic encapsulation film 142 which is farthest from the light emitting element 120, out of the inorganic encapsulation films 142. Since the end of the transparent oxide film 146 protrudes toward the pads 150 further or more than the end of the uppermost inorganic encapsulation film 142, a part of the transparent oxide film 146 is exposed by the uppermost inorganic encapsulation film 142. Oxygen contained in the part of the transparent oxide film 146 exposed by the uppermost inorganic encapsulation film 142 combines with hydrogen introduced from the outside. Therefore, the transparent oxide film 146 may prevent not only hydrogen introduced when the inorganic encapsulation films 142 are formed but also hydrogen introduced from the outside from diffusing into the active layer 134.

The transparent oxide film 146 shown in FIG. 3B includes a first transparent oxide film 146a contacting the cathode 126, and a second transparent oxide film 146b contacting the organic encapsulation film 144 so as to be disposed above the first transparent oxide film 146a.

Since the end of the first transparent oxide film 146a protrudes toward the side surface of the dam 158 in the array area AA further or more than the end of the lowermost inorganic encapsulation film 142, a part of the first transparent oxide film 146a is exposed by the lowermost inorganic encapsulation film 142. The second transparent oxide film 146b is disposed not only in the array area AA but also in a part of the pad area PA so as to cover the outer side surface 158d of dam 158. In an embodiment as shown in FIG. 2, second transparent oxide film 146b cover both side surfaces of the dam 158. Specifically, as shown in FIG. 2, second transparent oxide film 146b covers partially, the upper portion, of inner side surface 158c and covers fully the outer side surface 158d. The inner side surface 158c and outer side surface 158d are defined with respect to pad 156, 154. Namely, the outer side surface 158d is closer to pad 156, 154 than inner side surface 158c. It should be appreciated that it is not necessary that the second transparent oxide film 146b covers both side surfaces 158c and 158d of dam 158. It is possible that the second transparent oxide film 146b covers 158d without covering side surface 158c of dam 158, which is included in the disclosure. Since the end of the second transparent oxide film 146b protrudes toward the pads 150 further or more than the end of the uppermost inorganic encapsulation film 142, a part of the transparent oxide film 146b is exposed by the uppermost inorganic encapsulation film 142. Although FIG. 3B illustrates the first and second transparent oxide films 146a and 146b as not contacting each other, the first transparent oxide film 146a may be formed to cover both side surfaces of the dam 158 and thus the first and second transparent oxide films 146a and 146b may contact each other.

Beyond the examples shown herein, in FIGS. 2, 3A and 3B, other variants with respect to the relative positions of transparent oxide film 146 and inorganic encapsulation films 142 are also possible and included in the disclosure. For example, there may be multiple transparent oxide films 146 and multiple inorganic encapsulation films 142. Each of the multiple transparent oxide films 146 is disposed under a corresponding different one of the inorganic encapsulation films 142. Between a transparent oxide film 146 and the corresponding inorganic encapsulation film 142, there is no other transparent oxide film 142 and/or other inorganic encapsulation film 142. There might be some inorganic encapsulation film 142 that does not have a corresponding transparent oxide film 146 disposed therebelow.

Further each of the multiple transparent oxide film 146 may extend outward, with respect to the array area AA, beyond the corresponding one of the multiple inorganic encapsulation film 142. And, each of the multiple transparent oxide films 146 may cover an area larger than the corresponding one of the multiple inorganic encapsulation films.

As such, oxygen contained in the first and second transparent oxide films 146a and 146b exposed by the inorganic encapsulation films 142 combines with hydrogen introduced from the outside. Therefore, the first and second transparent oxide films 146a and 146b may prevent not only hydrogen introduced when the inorganic encapsulation films 142 are formed but also hydrogen introduced from the outside from diffusing into the active layer 134.

Hereinafter, test results of threshold voltage characteristics of a thin film transistor provided with no transparent oxide film 146 in accordance with a comparative example and a thin film transistor provided with a transparent oxide film 146 in accordance with a test example will be described as an illustrative example.

In the thin film transistor provided with no transparent oxide film 146 in accordance with the comparative example, threshold voltage is shifted by 5.1-7.3V from an initial state thereof due to hydrogen introduced when the inorganic encapsulation films 142 are formed. On the other hand, in the thin film transistor provided with the transparent oxide film 146 in accordance with the test example, the transparent oxide film 146 blocks hydrogen introduced when the inorganic encapsulation films 142 are formed and thus threshold voltage is shifted only by 0-1.25V. As such, as compared to the thin film transistor of the comparative example, in the thin film transistor of the test example of the present disclosure, change in threshold voltage of the thin film transistor in the positive direction is minimized. Therefore, in the thin film transistor of the test example of the present disclosure, Positive Bias Temperature illumination Stress (PBTiS) characteristics may be improved, as compared to the thin film transistor of the comparative example.

Figure 4A:
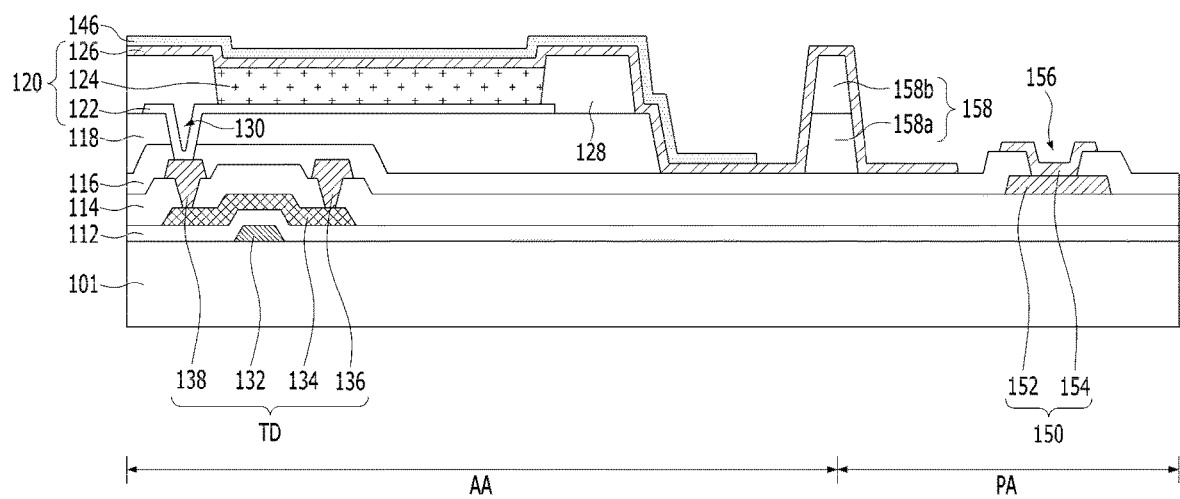
FIGS. 4A to 4C are cross-sectional views illustrating a method of manufacturing the organic light emitting display device shown in FIG. 2.
Figure 4B:
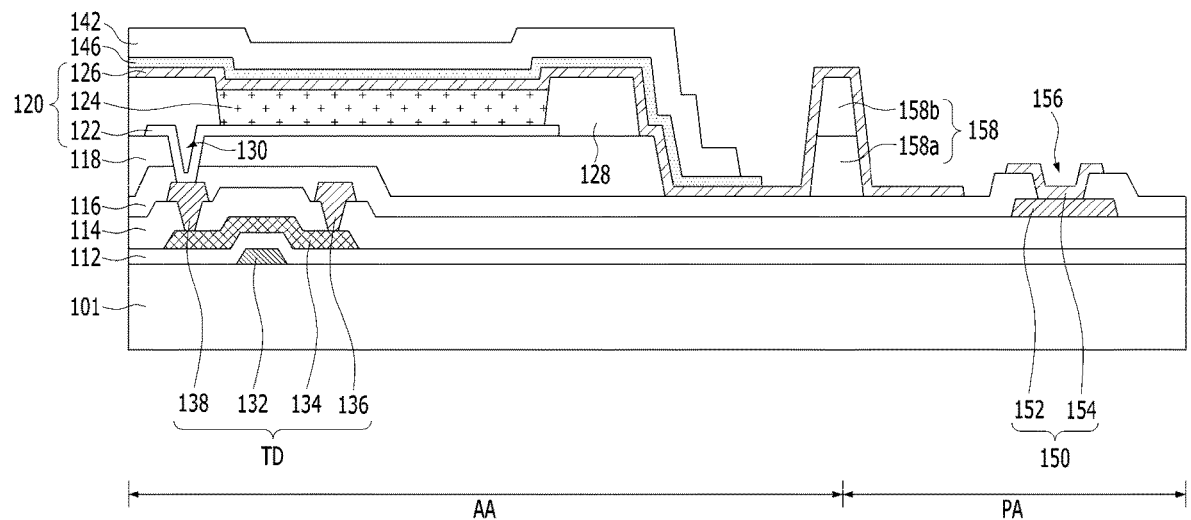
Figure 4C:
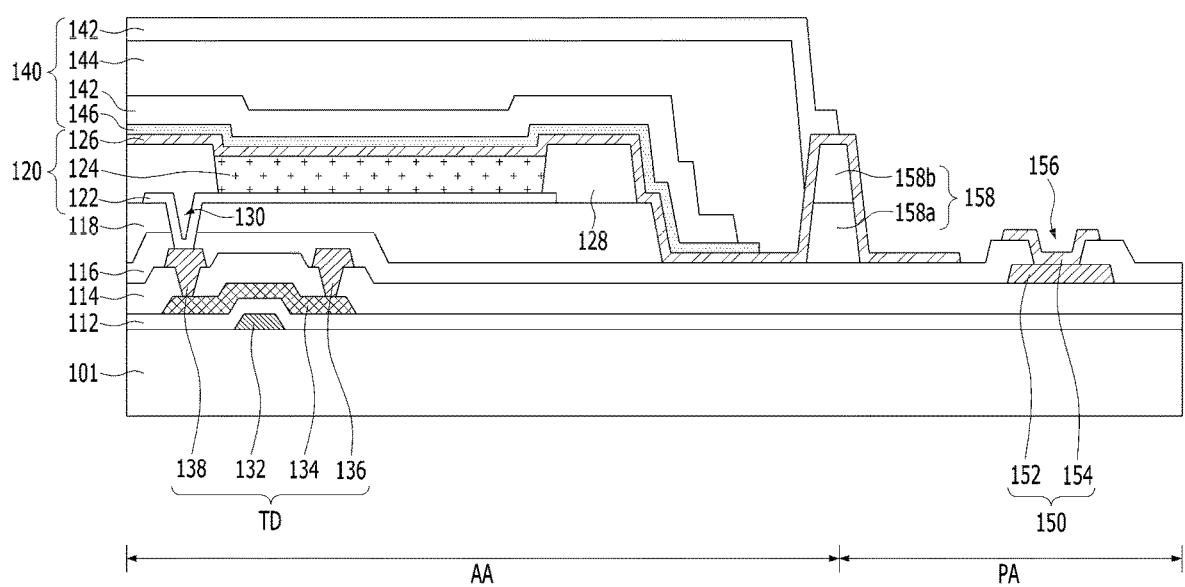

FIGS. 4A to 4C are cross-sectional views illustrating a method of manufacturing the organic light emitting display device shown in FIG. 2.

First, as shown in FIG. 4A, as an example, thin film transistors TS and TD having an active layer 134, a light emitting element 120, a dam 158 and pads 150 are formed on a substrate 101 through a plurality of mask processes. Thereafter, a transparent oxide film 146 is formed on the substrate 101 provided with the light emitting element 120 through a deposition method, such as sputtering. Here, the transparent oxide film 146 is formed of IGZO, IZO, ITO or ZnO. As shown in FIG. 4B, an inorganic encapsulation film 142 is formed on the substrate 101 provided with the transparent oxide film 146 through a deposition method, such as Chemical Vapor Deposition (CVD), Low Pressure Chemical Vapor Deposition (LPCVD) or Plasma Enhanced Chemical Vapor Deposition (PECVD). Here, the inorganic encapsulation film 142 is formed of SiOx, SiNx or SiON. Thereafter, as shown in FIG. 4C, an organic encapsulation film 144 is formed by coating the substrate 101 provided with the inorganic encapsulation film 142 with an organic insulating material. Here, the organic encapsulation film 144 is formed of an organic insulating material, such as an acrylic resin, an epoxy resin, polyimide, polyethylene or silicon oxycarbide (SiOC). Thereafter, another inorganic encapsulation film 142 is formed on the substrate 101 provided with the organic encapsulation film 144 through the above-described deposition, thus forming an encapsulation unit 140 having a multilayer structures. Thereafter, a protective film (not shown) is attached to the upper and side surfaces of the encapsulation unit 140 by an adhesive layer.

Although the organic light emitting display device including pixel driving circuits, each of which includes a switching thin film transistor TS and a driving thin film transistor TD, is described as an example, each of the pixel driving circuits of the organic light emitting display device in accordance with the present disclosure may further include a sensing transistor to sense threshold voltage of the driving thin film transistor TD.

As apparent from the above description, an organic light emitting display device in accordance with the present disclosure includes a transparent oxide film disposed between a cathode of a light emitting element and the lowermost inorganic encapsulation film closest to the light emitting element out of inorganic encapsulation films of an encapsulation unit. Therefore, oxygen in the transparent oxide film combines with hydrogen introduced when the inorganic encapsulation films are formed and thus hydrogen is prevented from permeating into thin film transistors, thereby preventing deterioration of the thin film transistors and improving reliability of the organic light emitting display device.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device comprising:
light emitting elements disposed on an array area of a substrate, the light emitting elements including an anode, a cathode and an organic light emitting layer positioned between the anode and the cathode; and
an encapsulation unit disposed on each of the light emitting elements, the encapsulation unit including:
a plurality of inorganic encapsulation films;
at least one organic encapsulation film disposed between the inorganic encapsulation films;
at least one transparent metal oxide film disposed under at least one of the inorganic encapsulation films and over an upper one of the anode or the cathode of the light emitting elements; and
a dam forming a boundary of the at least one organic encapsulation film, the at least one transparent metal oxide film including a first transparent metal oxide film that is positioned within the boundary formed by the dam, and the upper one of the anode or the cathode of the light emitting elements extends beyond the dam.

2. The organic light emitting display device according to claim 1, wherein the at least one transparent metal oxide film is disposed between a cathode of each of the light emitting elements and a lowermost inorganic encapsulation film that is closest to the cathode, out of the inorganic encapsulation films.

3. The organic light emitting display device according to claim 1, wherein the at least one transparent metal oxide film includes multiple transparent oxide films each disposed under a corresponding different one of the inorganic encapsulation films.

4. The organic light emitting display device according to claim 1,
wherein the at least one transparent metal oxide film protrudes toward the dam further than the lowermost inorganic encapsulation film out of the inorganic encapsulation films.

5. The organic light emitting display device according to claim 1, further comprising:
a pad disposed in a pad area of the substrate.

6. The organic light emitting display device according to claim 5,
wherein the at least one transparent metal oxide film includes a second transparent metal oxide film that is disposed to cover an upper surface and an outer side surface of the dam that is proximal to the pad.

7. The organic light emitting display device according to claim 1, wherein the at least one transparent metal oxide film contacts a cathode of each of the light emitting elements.

8. The organic light emitting display device according to claim 1, further comprising:
a thin film transistor connected to each of the light emitting elements,
wherein the at least one transparent metal oxide film is composed of a same material as an active layer of the thin film transistor.

9. The organic light emitting display device according to claim 1, wherein the at least one transparent metal oxide film is formed of at least one of IGZO, IZO, ITO or ZnO.

10. The organic light emitting display device according to claim 1, wherein:
the at least one transparent metal oxide film includes metal elements and oxygen elements with an oxygen to metal ratio greater than 1:1.

11. The organic light emitting display device according to claim 1, wherein the at least one transparent metal oxide film each has a thickness of 10 Å-5,000 Å.

12. An encapsulation unit comprising:
a plurality of inorganic encapsulation films;
at least one organic encapsulation film disposed between the inorganic encapsulation films; and
at least one transparent metal oxide film disposed under at least one of the inorganic encapsulation films, the at least one transparent metal oxide including an extension portion extending laterally outward beyond the at least one inorganic encapsulation film that is positioned above the at least one transparent oxide,
wherein the extension portion overlaps with the at least one organic encapsulation film beyond the at least one inorganic encapsulation film that is positioned above the at least one transparent oxide.

13. The encapsulation unit according to claim 12, wherein the at least one transparent metal oxide film is disposed under a lowermost inorganic encapsulation film of the inorganic encapsulation films.

14. The encapsulation unit according to claim 12, wherein the at least one transparent metal oxide film includes multiple transparent oxide films each disposed under a corresponding different one of each of the inorganic encapsulation films.

15. The encapsulation unit according to claim 12, wherein the at least one transparent metal oxide film is formed of IGZO, IZO, ITO or ZnO.

16. The encapsulation unit according to claim 12, wherein:
the at least one transparent metal oxide film includes metal elements and oxygen elements with an oxygen to metal ratio greater than 1:1.

17. The encapsulation unit according to claim 12, wherein the at least one transparent metal oxide film has a thickness of 10 Å-5,000 Å.

18. The encapsulation unit according to claim 14, wherein each of the multiple transparent metal oxide films extends outward beyond the corresponding one of the plurality of inorganic encapsulation films.

19. The encapsulation unit according to claim 14, wherein each of the multiple transparent metal oxide films covers an area larger than the corresponding one of the plurality of inorganic encapsulation films.

20. The organic light emitting display device according to claim 5, wherein the at least one transparent oxide metal film includes a second one transparent metal oxide film that protrudes toward the pad further than an uppermost inorganic encapsulation film out of the inorganic encapsulation films.

21. The organic light emitting display device according to claim 1, wherein the at least one transparent metal oxide film includes:
the first transparent metal oxide film protruding toward the dam further than a lowermost inorganic encapsulation film that is closest to the light emitting element, out of the inorganic encapsulation films, within the array area of substrate; and
a second transparent oxide film disposed on the first transparent oxide film and protruding toward the pad further than an uppermost inorganic encapsulation film out of the inorganic encapsulation films.

22. The organic light emitting display device according to claim 1, further comprising:
a thin film transistor connected to each of the light emitting elements,
wherein the pad includes:
a pad electrode formed on a same layer with a source electrode or a drain electrode of the thin film transistor; and
a pad cover electrode in contact with the pad electrode.

23. The organic light emitting display device according to claim 22, wherein the pad cover electrode is in a same layer with the transparent metal oxide film.

* * * * *